(12) United States Patent
Nakahata (10) Patent No.: US 9,388,489 B2
(45) Date of Patent: Jul. 12, 2016

(54) TUNGSTEN TARGET AND METHOD FOR PRODUCING SAME

(75) Inventor: Motomu Nakahata, Chiba (JP)

(73) Assignee: ULVAC, INC., Kanagawa (JP)

(*) Notice: Subject to any disclaimer, the term of this patent is extended or adjusted under 35 U.S.C. 154(b) by 622 days.

(21) Appl. No.: 13/822,524

(22) PCT Filed: Sep. 21, 2011

(86) PCT No.: PCT/JP2011/005299
§ 371 (c)(1),
(2), (4) Date: Mar. 12, 2013

(87) PCT Pub. No.: WO2012/042791
PCT Pub. Date: Apr. 5, 2012

(65) Prior Publication Data
US 2013/0220803 A1   Aug. 29, 2013

(30) Foreign Application Priority Data

Sep. 29, 2010   (JP) .................. 2010-218757

(51) Int. Cl.
*B22F 3/15* (2006.01)
*C23C 14/34* (2006.01)
*H01J 37/34* (2006.01)
*C23C 14/18* (2006.01)

(52) U.S. Cl.
CPC .............. *C23C 14/3414* (2013.01); *B22F 3/15* (2013.01); *H01J 37/3414* (2013.01); *H01J 37/3426* (2013.01); *C23C 14/185* (2013.01)

(58) Field of Classification Search
CPC ....................................... B22F 3/15
USPC ............................ 148/423, 513; 419/38, 42
See application file for complete search history.

(56) References Cited

U.S. PATENT DOCUMENTS 6,582,535 B1   6/2003   Suzuki et al.

FOREIGN PATENT DOCUMENTS

| JP | 10-183341 A | 7/1998 |
|----|-------------|--------|
| JP | 2001-098364 A | 4/2001 |
| JP | 2001-295036 A | 10/2001 |
| JP | 2003-049264 A | 2/2003 |
| JP | 2003-055758 A | 2/2003 |
| JP | 2003-193225 A | 7/2003 |
| JP | 2003-247063 A | 9/2003 |
| JP | 2005-171389 A | 6/2005 |

OTHER PUBLICATIONS

International Search Report in International Application No. PCT/JP2011/005299, filed Sep. 21, 2011.

*Primary Examiner* — Brian Walck
(74) *Attorney, Agent, or Firm* — Saliwanchik, Lloyd & Eisenschenk (57) ABSTRACT

[Problem] To suppress the generation of particles by reducing the average particle diameter to several dozen μm or less.
[Solution] After forming a preform of a tungsten powder, the preform is sintered. The preform is formed so as to have a relative density of 70-90% (inclusive) and an oxygen content of 100-500 ppm (inclusive). The sintering is carried out by a hot isostatic pressing method at 1,700-1,850° C. (inclusive). Consequently, a tungsten target which has an average particle diameter of 20 μm or less with a standard deviation of 10 μm or less, a relative density of 99% or more and an oxygen content of 10 ppm or less can be obtained. This tungsten target is capable of significantly reducing the generation of particles during sputtering.

2 Claims, 4 Drawing Sheets

TUNGSTEN TARGET AND METHOD FOR PRODUCING SAME

CROSS-RERERENCE TO RELATED APPLICATIONS

The application is the U.S. national stage application of International Patent Application No. PCT/JP2011/005299, filed Sep. 21, 2011, which claims priority to Japanese Application No. 2010-218757, filed Sep. 29, 2010, the disclosures of each of which are incorporated herein by Reference in their intirety.

TECHNICAL FIELD

The present invention relates to a tungsten target formed of a tungsten powder sintered compact and a method of producing the same.

BACKGROUND ART

In recent years, tungsten having heat resistance and low resistance characteristics is widely used as a wiring material and an electrode material in the semiconductor manufacturing art. A tungsten film is typically formed by a sputtering method. In the sputtering film formation of the tungsten film, argon ions produced by plasma discharge are collided with a tungsten target to knock tungsten fine particles out from a surface of the target and to deposit the tungsten fine particles on a substrate disposed facing to the target. At this time, it is known that there is a great problem in the process that particles produced from the surface of the target attach on the substrate to decrease properties of the film. Accordingly, a tungsten target having fine and uniform crystal grains and a high relative density is necessary for stably forming a high quality tungsten film.

For example, Patent Document 1 describes a method of producing a tungsten sputtering target where a small amount of molybdenum is added to tungsten powder in order to prevent particle generation. It is described that the method can provide a target having a relative density of 95% or more and an average particle diameter of 10 μm to 300 μm.

Patent Document 2 describes a method of producing a sputtering target by loading tungsten powder into a metal capsule, pressing the powder at normal temperature, capsuling under vacuum, and then hot isostatic pressing (HIP) the capsule. It is described that the method can provide a target having an average crystalline particle diameter of 20 μm to 100 μm, a relative density of 99% or more, and an oxygen content of 10 ppm to 15 ppm.

Patent Document 1: Japanese Patent Application Laid-open No. 2001-295036
Patent Document 2: Japanese Patent Application Laid-open No. 2003-193225

DISCLOSURE OF THE INVENTION

Problem to be Solved by the Invention

In the conventional method of producing the tungsten target, the average crystalline particle diameter varies widely, so that fine and uniform particles having the average particle diameter of several tens μm or less cannot be provided. Therefore, particles generation during sputtering is not sufficiently inhibited, and it is difficult to form a high quality tungsten film stably.

In view of the circumstances as described above, an object of the present invention is to provide a tungsten target having an average particle diameter of several tens μm or less and a method of producing the tungsten target.

Means for solving the Problem

In order to achieve the above-mentioned object, a method of producing a tungsten target according to an aspect of the present invention comprises the step of producing a preform compact having a relative density of from 70% or more to 90% or less and an oxygen content of from 100 ppm or more to 500 ppm or less.

The preform compact is sintered by a hot isostatic pressing method at a temperature of from 1700° C. or more to 1850° C. or less.

The tungsten target according to an aspect of the present invention has an average particle diameter of 20 μm or less with standard deviation of 10 μm or less, having a relative density of 99% or more, and an oxygen content of 10 ppm or less.

BRIEF DESCRIPTION OF DRAWINGS

FIG. 4 A diagram showing a surface status of a sintered compact sample produced by an embodiment of the present invention; (A) is an optical micrograph, and (B) is a processing screen of a particle diameter measuring apparatus.

FIG. 5 A diagram showing a surface status of another sintered compact sample produced by an embodiment of the present invention; (A) is an optical micrograph, and (B) is a processing screen of a particle diameter measuring apparatus.

FIG. 6 A diagram showing a surface status of a still another sintered compact sample produced by an embodiment of the present invention; (A) is an optical micrograph, and (B) is a processing screen of a particle diameter measuring apparatus.

BEST MODE(S) FOR CARRYING OUT THE INVENTION

A method of producing a tungsten target according to an embodiment of the present invention comprises the step of producing a preform compact having a relative density of from 70% or more to 90% or less and an oxygen content of from 100 ppm or more to 500 ppm or less.

The preform compact is sintered by a hot isostatic pressing method at a temperature of from 1700° C. or more to 1850° C. or less.

An amount of particle generation in a sputtering target correlates strongly with a relative density, an average particle diameter, and oxygen content of a sintered compact. The lower the relative density, the greater the average particle diameter or the greater the oxygen content of the sintered compact is, the higher a possibility of the particle generation is. On the other hand, when the particle diameter varies widely, even if the average particle diameter is fine, an increase in particles cannot be inhibited. The present inventors have found that the relative density, the average particle diameter, the oxygen content and the like of the sintered compact depend on the relative density and the oxygen content of the preform compact, and arrived at the present invention.

Specifically, in the method of producing the tungsten target according to the present embodiment, the preform compact is produced to have the relative density of from 70% or more to 90% or less and the oxygen content of from 100 ppm or more to 500 ppm or less. If the relative density of the preform compact is less than 70%, the particle diameter of the sintered compact becomes large. If the relative density of the preform compact exceeds 90%, oxygen in a compact remained upon sintering cannot be fully discharged (degassed), and it becomes difficult to decrease the oxygen content of the sintered compact. On the other hand, if the oxygen content of the preform compact is less than 100 ppm, the oxygen content of the sintered compact can be kept low, but the particle diameter of the sintered compact tends to be large. Furthermore, if the oxygen content of the preform compact exceeds 500 ppm, the particle diameter of the sintered compact can be decreased, but it becomes difficult to decrease the oxygen content of the sintered compact.

The preform compact is produced by any non-limiting method, and may be produced, for example, by a hot pressing (HP) method, or other forming methods (a cold isostatic pressing (CIP) method, a hot isostatic pressing (HIP) method and the like). When the preform compact is produced by the hot pressing method, the temperature and the pressure conditions are, for example, at 1400° C. and 39.2 MPa (400 kg/cm2).

The preform compact is sintered by the hot isostatic pressing (HIP) method. The sintering temperature is set to 1700° C. or more to 1850° C. or less. If the sintering temperature is less than 1700° C., the processing temperature is low, so that it is difficult to achieve the high relative density of 99% or more within the processing time suitable for mass production. If the sintering temperature exceeds 1850° C., the processing temperature is high, so that the particle diameter of the sintered compact becomes large and cannot be decreased and be uniform.

According to the above-mentioned method of producing the tungsten target, the sputtering target can be provided with less particle generation. For example, the above-mentioned production method can stably produce the tungsten sintered compact having an average particle diameter of 20 µm with standard deviation of 10 µm or less, having a relative density of 99% or more, and an oxygen content of 10 ppm or less.

The sintering temperature of the above-mentioned preform compact can be, for example, 1700° C. or more to 1750° C. or less. It is therefore possible to produce the tungsten sintered compact, for example, having the average particle diameter of 15 µm or less and to further make the sintered particles smaller.

The tungsten target according to an embodiment of the present invention has an average particle diameter of 20 µm or less with standard deviation of 10 µm or less, has a relative density of 99% or more and an oxygen content of 10 ppm or less.

It is therefore possible to significantly decrease the particle generation, and stably form the high performance tungsten film.

Hereinafter, referring to the drawings, the embodiments of the present invention will be described.

Figure 1:
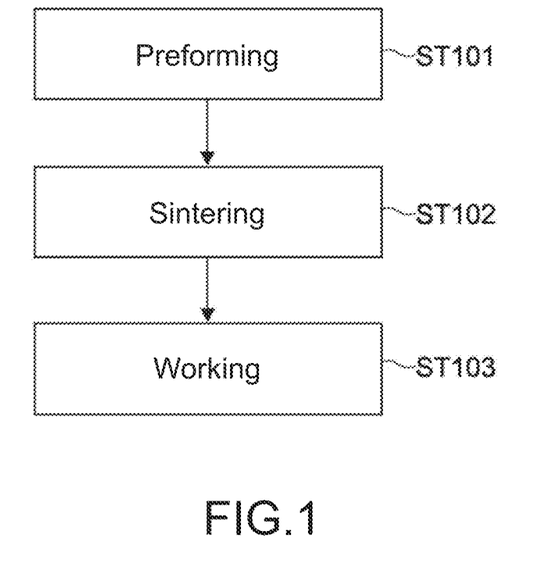
FIG. 1 A process chart of illustrating a method of producing a tungsten target according to an embodiment of the present invention.

FIG. 1 is a schematic process chart of illustrating a method of producing a tungsten target according to an embodiment of the present invention. The method of producing the tungsten target according to the present embodiment includes a step of producing a preform compact (step 101), a step of sintering the preform compact (step 102), and a step of working the sintered compact (step 103).

[Preforming Step]

The preform compact is produced by press-forming raw material powder into a predetermined form. The raw material powder is high purity tungsten powder having, for example, a purity of 99.999 (5N) or more. Since the oxygen content of the raw material powder affects the oxygen content of the preform compact, the oxygen content of the row material powder is to be 500 ppm or less, for example. The raw material powder may have a non-limiting average particle diameter, and is tungsten powder having an average particle diameter by a BET method of 3.5 µm to 4.5 µm.

In the present embodiment, the preform compact is produced by a vacuum hot pressing method, but is not limited thereto, and may be produced by other pressing method including a hot pressing method under atmospheric pressure, a cold isostatic pressing method, and a hot isostatic pressing method.

Figure 2:
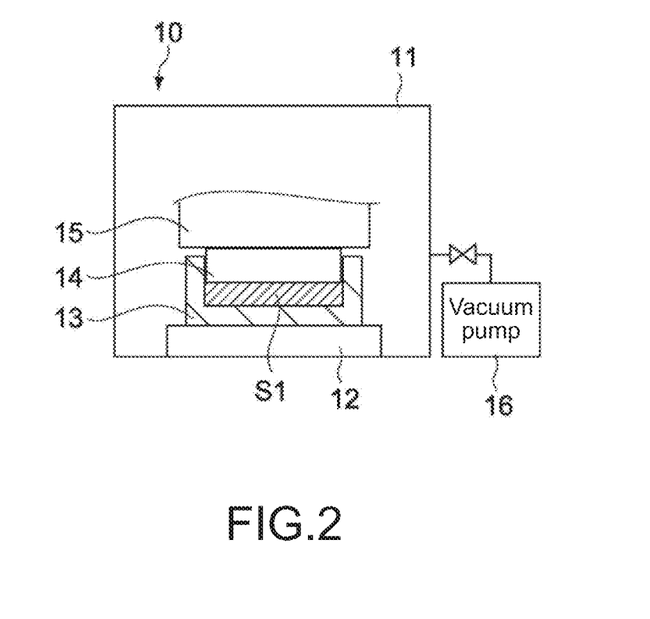
FIG. 2 A schematic diagram of an apparatus of illustrating a vacuum hot pressing method.

FIG. 2 is a schematic diagram of an apparatus of illustrating a vacuum hot pressing method. A vacuum hot pressing apparatus 10 includes a chamber 11, a base 12 disposed inside of the chamber 11, an outer frame 13 disposed over the base 12, a punch 14 fitted into an internal void space of the outer frame 13, a ram 15 for heating and pressing the punch 14, and a vacuum pump 16 for evacuating the chamber 11 inside. The internal void space is filled with the raw material powder. After the inside of the chamber 11 is vacuum evacuated to a predetermined pressure, the raw material powder is pressed at a predetermined pressure while heating at a predetermined temperature with the punch 14. In this way, a preform compact S1 of the raw material powder is produced.

The preform compact S1 is formed into, for example a circle or a rectangular plate. In the present embodiment, the circle plate preform compact S1 is produced. The shape of the preform compact 51 is determined by each shape of the internal void space of the outer frame 13 and the punch 14. By producing the preform compact S1 using the vacuum hot pressing method, it is possible to facilitate degassing of the preform compact S1 and decrease the oxygen content contained in the preform compact 51.

In the preforming step, the preform compact S1 of tungsten powder having the relative density of from 70% or more to 90% or less and the oxygen content of from 100 ppm or more to 500 ppm or less is produced. Hot pressing temperature and pressure conditions for producing the preform compact 51 having such properties are not especially limited, but are, for example, 1400° C. to 1650° C. and 39.2 MPa (400 kg/cm2) to 44.1 MPa (450 kg/cm2). The pressing time is, for example, one hour to six hours.

If the relative density of the preform compact S1 is less than 70%, the particle diameter of the sintered compact becomes large. If the relative density of the preform compact S1 exceeds 90%, oxygen in the compact 51 remained upon sintering cannot be fully discharged (degassed), and it becomes difficult to decrease the oxygen content of the sintered compact. On the other hand, if the oxygen content of the preform compact 51 is less than 100 ppm, the oxygen content of the sintered compact becomes low, but the particle diameter of the sintered compact tends to be large. Furthermore, if the oxygen content of the preform compact S1 exceeds 500 ppm, the particle diameter of the sintered compact can be decreased, but it becomes difficult to decrease the oxygen content of the sintered compact.

[Sintering Step]

Figure 3:
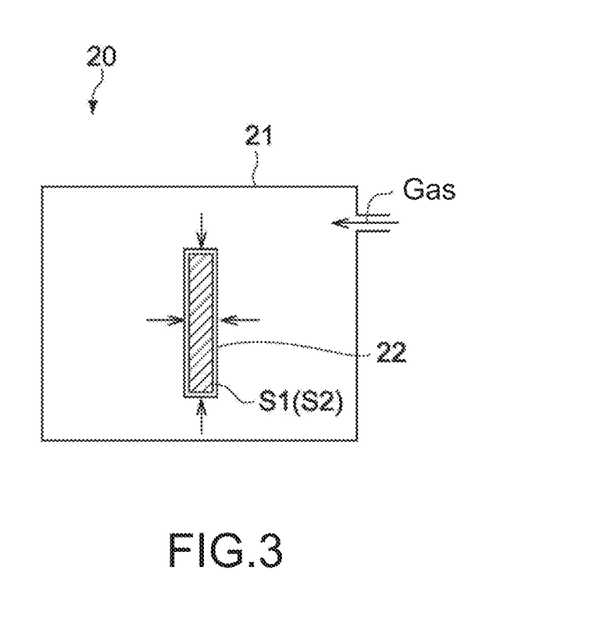
FIG. 3 A schematic diagram of an apparatus of illustrating a hot isostatic pressing method.

The preform compact S1 is sintered by a hot isostatic pressing (HIP) method. FIG. 3 is a schematic diagram of illustrating a hot isostatic pressing method. A hot isostatic pressing apparatus 20 includes a chamber 21 and a canning member 22 disposed inside of the chamber 21, housing a sintering material (the preform compact S1) and the like. In the sintering step, the preform compact S1 wrapped with the canning member 22 is disposed inside of the chamber 21, the inside of the chamber is filled with a high temperature and high pressure gas, and the status is kept for a predetermined time. A heater (a heating source) may be disposed inside of the chamber 21. In this way, the sintering of the preform compact 21 proceeds to produce a sintered compact S2 of the tungsten powder.

As a pressure medium (gas), an inert gas such as nitrogen and argon heated to the predetermined temperature is used. As the canning member, niobium, tantalum or the like is used. Since these materials have high oxygen absorption properties, residual oxygen can be easily removed from the preform compact 51 upon sintering.

The sintering temperature of the preform compact S1 is 1700° C. or more to 1850° C. or less. If the sintering temperature is less than 1700° C., the processing temperature is low, so that it is difficult to achieve the high relative density of 99% or more within the processing time suitable for mass production. If the sintering temperature exceeds 1850° C., the processing temperature is high, so that the particle diameter of the sintered compact becomes large and cannot be decreased and be uniform. The pressure is not especially limited, but is, for example, 100 to 200 MPa. In the present embodiment, the pressure is 176.4 MPa (1800 kg/cm2).

Figure 4A:
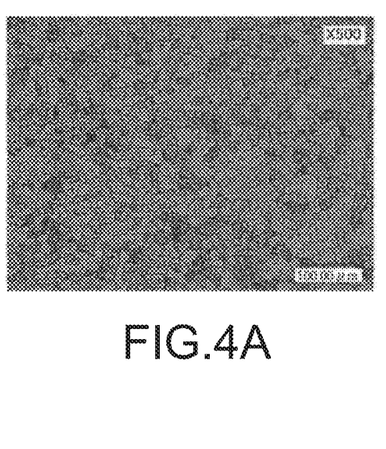
Figure 4B:
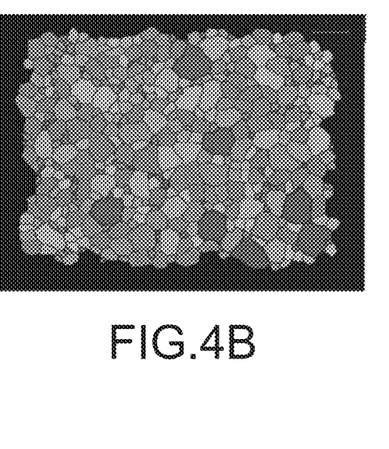
Figure 5A:
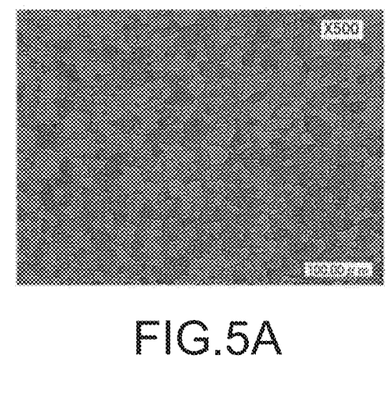
Figure 5B:
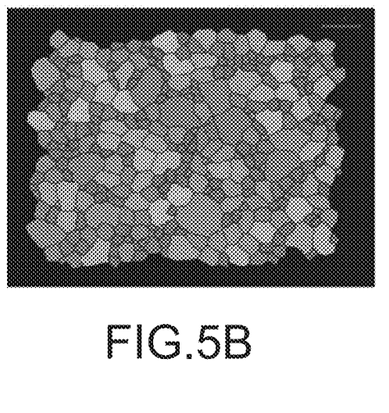
Figure 6A:
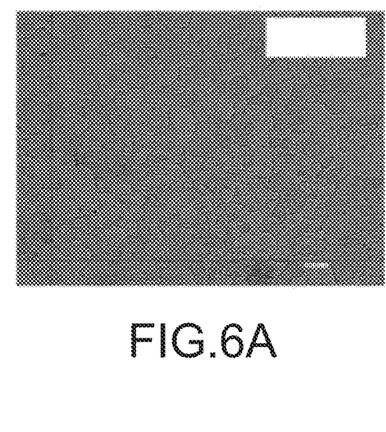
Figure 6B:
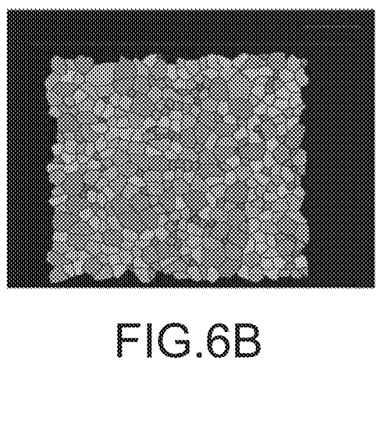

The sintering temperature correlates with each of the relative density and the average particle diameter of the sintered compact. Assuming that the relative density and the oxygen content of the preform compact are uniform, the higher the sintering temperature is, the higher the relative density is and the greater the average particle diameter is. FIGS. 4 to 6 show surface statuses of the sintered compact produced by varying the sintering processing temperature of the HIP. Each (A) is an optical micrograph (magnification 500×), and each (B) is a processing screen for measuring the average particle diameter using a particle diameter measuring apparatus "Leica Q500IW" manufactured by Leica Microsystems.

Specifically, FIG. 4 shows a sintered compact sample processed at a temperature of 1700° C. The sample has the relative density of 99.2% and the average particle diameter of 9.91 µm (maximum particle diameter of 29.32 µm, standard deviation of 5.13 µm). FIG. 5 shows a sintered compact sample processed at a temperature of 1750° C. The sample has the relative density of 99.5% and the average particle diameter of 11.21 µm (maximum particle diameter of 34.35 µm, standard deviation of 5.18 µm). FIG. 6 shows a sintered compact sample processed at a temperature of 1850° C. The sample has the relative density of 99.7% and the average particle diameter of 19.76 µm (maximum particle diameter of 48.38 µm, standard deviation of 7.61 µm).

According to the present embodiment, the tungsten sintered compact S2 having an average particle diameter of 20 µm or less (with standard deviation of 10 µm or less), having the relative density of 99% or more, and the oxygen content of 10 ppm or less. In this way, it can be provided the tungsten sputtering target with decreased particle generation. In particular, since the standard deviation of the average particle diameter in the sintered compact is very small—as low as less than 10 µm, fine average particle diameter can be obtained uniformly with the small variation in the particle diameter.

Consequently, the sputtering target according to the present embodiment can be used to stably form a high quality tungsten film.

[Working Step]

The sintered compact S2 produced is worked into a predetermined target shape in a working step. A method of working is not especially limited. Typically, a mechanical working method such as grinding and cutting is applicable. Working size and shape depend on the specification of the target. For example, the target is worked into a circle or a rectangular shape. The sintered compact worked is adhered to a backing plate, thereby configuring a sputtering cathode.

EXAMPLE

Example 1

A preform compact having a diameter of 500 mm and a thickness of 12 mm was produced using tungsten powder with purity of 99.999% having an average particle diameter of 3.5 µm to 4.5 µm (by a BET method) and an oxygen content of 500 ppm by a vacuum hot pressing (HP) method. The HP conditions were set to a temperature of 1550° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 70%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.2%. The sintered compact was measured for an average particle diameter and its standard deviation. The average particle diameter was 11 µm, and the standard deviation was 5.5 µm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was nine.

Example 2

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.2%. The sintered compact was measured for an average particle diameter and its standard deviation. The average particle diameter was 10 μm, and the standard deviation was 5 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was eight.

Example 3

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1650° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 90%. Upon the working, an analytical sample (block) was taken to measure the oxygen content, which was 380 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.3%. The sintered compact was measured for an average particle diameter and its standard deviation. The average particle diameter was 12 μm, and the standard deviation was 5.5 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was ten.

Example 4

A preform compact having a diameter of 500 mm and a thickness of 12 mm was produced using tungsten powder with purity of 99.999% having an average particle diameter of 3.5 μm to 4.5 μm (by a BET method) and an oxygen content of 250 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 100 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), and was measured its size by a caliper and weighed by an electric balance to determine a relative density. As a result, the sintered compact had the relative density of 99.2%. The sintered compact was measured for an average particle diameter and its standard deviation. The average particle diameter was 18 µm, and the standard deviation was 8 µm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 µm or more, and the number of the particles was eight.

Example 5

A preform compact having a diameter of 500 mm and a thickness of 12 mm was produced using tungsten powder with purity of 99.999% having an average particle diameter of 3.5 µm to 4.5 µm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), and was measured its size by a caliper and weighed by an electric balance to determine a relative density. As a result, the sintered compact had the relative density of 99.2%. The sintered compact was measured for an average particle diameter and its standard deviation. The average particle diameter was 10 µm, and the standard deviation was 5 µm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 µm or more, and the number of the particles was eight.

Example 6

A preform compact having a diameter of 500 mm and a thickness of 12 mm was produced using tungsten powder with purity of 99.999% having an average particle diameter of 3.5 µm to 4.5 µm (by a BET method) and an oxygen content of 570 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 500 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), and was measured its size by a caliper and weighed by an electric balance to determine a relative density. As a result, the sintered compact had the relative density of 99.4%. The sintered compact was measured for an average particle diameter and its standard deviation. The average particle diameter was 10 µm, and the standard deviation was 5 µm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 µm or more, and the number of the particles was seven.

Example 7

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.2%. The sintered compact was measured for an average particle diameter and its standard deviation. The average particle diameter was 10 μm, and the standard deviation was 5 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was seven.

Example 8

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1750° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.4%. The sintered compact was measured for an average particle diameter and its standard deviation. The average particle diameter was 15 μm, and the standard deviation was 8 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was eight.

Example 9

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1800° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.5%. The sintered compact was measured for an average particle diameter and its standard deviation. The average particle diameter was 18 μm, and the standard deviation was 9 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 13.

Example 10

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density) (tungsten theoretical density)/((weight)/(volume)), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1850° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.8%. The sintered compact was measured for an average particle diameter and its standard deviation. The average particle diameter was 18 μm, and the standard deviation was 9 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 13.

Comparative Example 1

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1500° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density) (tungsten theoretical density)/((weight)/(volume)), and was 60%. Upon the working, an analytical sample (block) was taken to measure the oxygen content, which was 450 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.0%. The sintered compact was measured for an average particle diameter and its standard deviation. The average particle diameter was 40 μm, and the standard deviation was 30 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 47.

Comparative Example 2

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1650° C., a pressure of 44.1 MPa (450 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 95%. Upon the working, an analytical sample (block) was taken to measure the oxygen content, which was 300 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.4%. The sintered compact was measured for an average particle diameter and its standard deviation. The average particle diameter was 9 μm, and the standard deviation was 5 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was 90 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 30.

Comparative Example 3

A preform compact having a diameter of 500 mm and a thickness of 12 mm was produced using tungsten powder with purity of 99.999% having an average particle diameter of 3.5 μm to 4.5 μm (by a BET method) and an oxygen content of 180 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 80 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.4%. The sintered compact was measured for an average particle diameter and its standard deviation. The average particle diameter was 80 μm, and the standard deviation was 60 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 63.

Comparative Example 4

A preform compact having a diameter of 500 mm and a thickness of 12 mm was produced using tungsten powder with purity of 99.999% having an average particle diameter of 3.5 μm to 4.5 μm (by a BET method) and an oxygen content of 700 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 650 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.3%. The sintered compact was measured for an average particle diameter and its standard deviation. The average particle diameter was 8 μm, and the standard deviation was 5 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was 60 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 27.

Comparative Example 5

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1650° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 98.5%. The sintered compact was measured for an average particle diameter and its standard deviation. The average particle diameter was 8 μm, and the standard deviation was 5 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 55.

Comparative Example 6

A preform compact having a diameter of 500 mm and a thickness of 12 mm was produced using tungsten powder with purity of 99.999% having an average particle diameter of 3.5 μm to 4.5 μm (by a BET method) and an oxygen content of 500 ppm by a vacuum hot pressing (HP) method. The HP conditions were set to a temperature of 1600° C., a pressure of 39.2 MPa (400 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 80%. Upon the working, an analytical sample (block) was taken to measure the oxygen content, which was 400 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1900° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.8%. The sintered compact was measured for an average particle diameter and its standard deviation. The average particle diameter was 40 μm, and the standard deviation was 30 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 42.

Comparative Example 7

A preform compact having a diameter of 500 mm and a thickness of 12 mm was produced using tungsten powder with purity of 99.999% having an average particle diameter of 3.5 μm to 4.5 μm (by a BET method) and an oxygen content of 700 ppm by a vacuum hot pressing (HP) method. The HP conditions were set to a temperature of 1650° C., a pressure of 44.1 MPa (450 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 93%. Upon the working, an analytical sample (block) was taken to measure the oxygen content, which was 600 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1700° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.2%. The sintered compact was measured for an average particle diameter and its standard deviation. The average particle diameter was 10 μm, and the standard deviation was 15 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 30.

Comparative Example 8

A preform compact having a diameter of 500 mm and a thickness of 12 mm was produced using tungsten powder with purity of 99.999% having an average particle diameter of 3.5 μm to 4.5 μm (by a BET method) and an oxygen content of 700 ppm by a vacuum hot pressing (HP) method. The HP conditions were set to a temperature of 1650° C., a pressure of 44.1 MPa (450 kg/cm2), a press holding time of three hours.

The resultant preform compact was lathe worked, and then was measured its size by a caliper and weighed by an electric balance. A relative density of the preform compact was determined by the equation of ((weight)/(volume))/(tungsten theoretical density), and was 93%. Upon the working, an analytical sample (block) was taken to measure the oxygen content, which was 600 ppm. For the oxygen content analysis, an analysis apparatus "TC-436" manufactured by LECO Corporation was used.

Next, the resultant preform compact was set to a niobium capsule, and the capsule was then sealed by an electron beam welding. Thereafter, the preform compact was sintered by a hot isostatic pressing (HIP) processing. The HIP conditions were set to a temperature of 1750° C., a pressure of 176.4 MPa (1800 kg/cm2), a press holding time of three hours. As a result, a tungsten sintered compact having a diameter of 460 mm and a thickness of 11 mm was provided.

The resultant tungsten sintered compact was ground by a lathe, worked into a predetermined target shape (having a diameter of 440 mm and a thickness of 6 mm), was measured its size by a caliper and weighed by an electric balance to determine a relative density. As a result, the sintered compact had the relative density of 99.4%. The sintered compact was measured for an average particle diameter and its standard deviation. The average particle diameter was 15 μm, and the standard deviation was 20 μm. For the average particle diameter and the standard deviation measurements, a particle diameter measuring apparatus "Leica Q500IW" manufactured by Leica Microsystems was used. Using an analysis apparatus "TC-436" manufactured by LECO Corporation, the oxygen content of the sintered compact was measured, and was less than 10 ppm.

Subsequently, the resultant tungsten target was bonded to an aluminum backing plate with an SnAg based wax material, thereby configuring a sputtering cathode. The sputtering cathode was incorporated into a sputtering apparatus "ENTRON™" manufactured by ULVAC, Inc. to form a tungsten thin film on a semiconductor wafer having a diameter of 300 mm. Thereafter, a surface analyzer "WM-100" manufactured by TOPCON Corporation was used to inspect the surface of the wafer to count the number of particles having a size of 0.2 μm or more, and the number of the particles was 40.

Results in Examples 1 to 10 and Comparative Examples 1 to 8 are shown in Table 1.

TABLE 1

| | Major production conditions | | | | | | W target properties | | | | |
|---|---|---|---|---|---|---|---|---|---|---|---|
| | | Forming conditons | | Relative | | | | Standard deviation of | | | |
| | HIP conditon (° C.) | HP temperature (° C.) | HP pressure (kg/cm2) | density of compact (%) | Oxygen content (ppm) | | Average diameter of target (μm) | average diameter of target (μm) | Oxygen content of target | Relative density (%) | Evaluation Particle (number) |
| | | | | | Powder | Compact | | | | | |
| Ex. 1 | 1700 | 1550 | 400 | 70 | 500 | 400 | 11 | 5.5 | <10 | 99.2 | 9 |
| Ex. 2 | 1700 | 1600 | 400 | 80 | 500 | 400 | 10 | 5 | <10 | 99.2 | 8 |
| Ex. 3 | 1700 | 1650 | 400 | 90 | 500 | 380 | 12 | 5.5 | <10 | 99.3 | 10 |
| Ex. 4 | 1700 | 1600 | 400 | 80 | 250 | 100 | 18 | 8 | <10 | 99.2 | 8 |
| Ex. 5 | 1700 | 1600 | 400 | 80 | 500 | 400 | 10 | 5 | <10 | 99.2 | 8 |
| Ex. 6 | 1700 | 1600 | 400 | 80 | 570 | 500 | 10 | 5 | <10 | 99.4 | 7 |
| Ex. 7 | 1700 | 1600 | 400 | 80 | 500 | 400 | 10 | 5 | <10 | 99.2 | 7 |
| Ex. 8 | 1750 | 1600 | 400 | 80 | 500 | 400 | 15 | 8 | <10 | 99.4 | 8 |
| Ex. 9 | 1800 | 1600 | 400 | 80 | 500 | 400 | 18 | 9 | <10 | 99.5 | 13 |
| Ex. 10 | 1850 | 1600 | 400 | 80 | 500 | 400 | 18 | 9 | <10 | 99.8 | 13 |
| Comp. Ex. 1 | 1700 | 1500 | 400 | 60 | 500 | 450 | 40 | 30 | 10 | 99.0 | 47 |
| Comp. Ex. 2 | 1700 | 1650 | 450 | 95 | 500 | 300 | 9 | 5 | 90 | 99.4 | 30 |

TABLE 1-continued

|  | Major production conditions | | | | | | W target properties | | | | |
|---|---|---|---|---|---|---|---|---|---|---|---|
|  |  | Forming conditons | | Relative | | | | Standard deviation of | | | |
|  | HIP conditon | HP temperature | HP pressure | density of compact | Oxygen content (ppm) | | Average diameter of | average diameter of | Oxygen content of | Relative density | Evaluation Particle |
|  | (° C.) | (° C.) | (kg/cm2) | (%) | Powder | Compact | target (μm) | target (μm) | target | (%) | (number) |
| Comp. Ex. 3 | 1700 | 1600 | 400 | 80 | 180 | 80 | 80 | 60 | <10 | 99.4 | 63 |
| Comp. Ex. 4 | 1700 | 1600 | 400 | 80 | 700 | 650 | 8 | 5 | 60 | 99.3 | 27 |
| Comp. Ex. 5 | 1650 | 1600 | 400 | 80 | 500 | 400 | 8 | 5 | <10 | 98.5 | 55 |
| Comp. Ex. 6 | 1900 | 1600 | 400 | 80 | 500 | 400 | 40 | 30 | <10 | 99.8 | 42 |
| Comp. Ex. 7 | 1700 | 1650 | 450 | 93 | 700 | 600 | 10 | 15 | <10 | 99.2 | 30 |
| Comp. Ex. 8 | 1750 | 1650 | 450 | 93 | 700 | 600 | 15 | 20 | <10 | 99.4 | 40 |

In each of Examples 1 to 10, the preform compact of tungsten powder is adjusted to have the relative density of from 70% or more to 90% or less, and the oxygen content of from 100 ppm or more to 500 ppm or less. The preform compact is HIP processed at a temperature of from 1700° C. or more to 1850° C. or less to provide the tungsten sintered compact having an average particle diameter of 20 μm or less with standard deviation of 10 μm or less, a relative density of 99% or more, and an oxygen content of 10 ppm or less. When such a sintered compact is used for a sputtering target, the particle generation can be effectively inhibited. It is thus possible to form a high quality tungsten thin film stably.

In each of Examples 1 to 8, by the tungsten target that is HIP processed at a temperature of from 1700° C. or more to 1750° C. or less, the average particle diameter in the sintered compact can be less varied, whereby the particle generation can be further decreased.

In Comparative Example 1, the preform compact had the relative density of 60%, which was lower than that of the preform compact in Example 1. Therefore, it was not possible to provide the sintered compact having the relative density of more than 99%. In addition, the sintered compact in Comparative Example 1 had the average particle diameter of as large as 40 μm, and the standard deviation of as relatively large as 30 μm. As a result, a possibility of the particle generation was high, and it was confirmed that the number of particles in Comparative Example 1 was five times or more greater than that in Example 1.

In Comparative Example 2, the preform compact had the higher relative density of 95% than that in Example 3. Therefore, it was possible to provide the sintered compact having the relative density of more than 99%. However, the oxygen content of the sintered compact in Comparative Example 2 was as high as 90 ppm, because degassing upon sintering was insufficient. As a result, a possibility of the particle generation was high, and it was confirmed that the number of particles in Comparative Example 2 was three times or more greater than that in Example 3.

In Comparative Example 3, the preform compact had the oxygen content of 80 ppm was lower than that of the preform compact in Example 4. Therefore, it was possible to keep the oxygen content of the sintered compact low. However, it was confirmed that the sintered compact in Comparative Example 3 had the greater average particle diameter, which had a tendency to be varied widely. As a result, a possibility of the particle generation was high, and it was confirmed that the number of particles in Comparative Example 3 was seven times or more greater than that in Example 4.

In Comparative Example 4, the preform compact had the oxygen content of 650 ppm, which was higher than that of the preform compact in Example 6. Therefore, it was possible to keep the average particle diameter and the standard deviation of the sintered compact in Comparative Example 4 low. However, degassing upon sintering became insufficient. As a result, a possibility of the particle generation was as high as 60 ppm, and it was confirmed that the number of particles in Comparative Example 4 was three times or more greater than that in Example 6.

In Comparative Example 5, the sintering temperature of the preform compact was 1650° C., which was lower than that of the preform compact in Example 1. It was confirmed that the relative density of the sintered compact was as low as 98.5%. As a result, a possibility of the particle generation was high, and it was confirmed that the number of particles in Comparative Example 5 was three times or more greater than that in Example 1.

In Comparative Example 6, the sintering temperature of the preform compact was 1900° C., which was higher than that of the preform compact in Example 10. It was confirmed that the average particle diameter and the standard deviation of the sintered compact in Comparative Example 6 were great. As a result, a possibility of the particle generation was high, and it was confirmed that the number of particles in Comparative Example 6 was three times or more greater than that in Example 10.

In Comparative Example 7, because the preform compact had the relative density of 93% and the oxygen content of 600 μm, which were higher than those of the preform compact in Example 3, it was confirmed that the standard deviation of the average particle diameter of the sintered compact was high. As a result, a possibility of the particle generation was high, and it was confirmed that the number of particles in Comparative Example 7 was three times or more greater than that in Example 3.

In Comparative Example 8, because the preform compact had the relative density of 93% and the oxygen content of 600 μm, which were higher than those of the preform compact in Example 8, it was confirmed that the standard deviation of the average particle diameter of the sintered compact was high. As a result, a possibility of the particle generation was high, and it was confirmed that the number of particles in Comparative Example 8 was five times or more greater than that in Example 8.

Although the embodiments of the present invention have been described, the present invention is not limited thereto, and variations and modifications may be made based on the technical features of the present invention.

For example, in the embodiment as described above, the preform compact is produced by a vacuum hot pressing method, but is not limited thereto. Other pressing methods such as a cold isostatic pressing (CIP) method, a hot isostatic pressing (HIP) method as well as a hot pressing under atmospheric pressure may be used.

DESCRIPTION OF REFERENCE NUMERALS

10 vacuum hot pressing apparatus
20 hot isostatic pressing apparatus
S1 preform compact
S2 sintered compact

The invention claimed is:

1. A method of producing a tungsten target, comprising:
   producing a preform compact of tungsten powder having a relative density of from 70% or more to 90% or less and an oxygen content of from 100 ppm by mass to 500ppm by mass, and
   sintering the preform compact by a hot isostatic pressing method at a temperature of from 1700° C. or more to 1850° C. or less.

2. The method of producing the tungsten target according to claim 1, wherein a sintering temperature of the preform compact is 1700° C. or more to 1750° C. or less.

\* \* \* \* \*